United States Patent [19]

Fukaya et al.

[11] Patent Number: 4,763,010
[45] Date of Patent: Aug. 9, 1988

[54] LONG SIZE IMAGE SENSOR HAVING IMPROVED CONSISTENCY AMONG INDIVIDUAL PHOTOSENSORS

[75] Inventors: Masaki Fukaya, Yokohama; Toshiyuki Komatsu, Yamato; Tatsumi Shoji, Hiratsuka; Masaru Kamio, Atsugi; Nobuyuki Sekimura, Kawasaki, all of Japan

[73] Assignee: Canon Kabushiki Kaisha, Japan

[21] Appl. No.: 24,701

[22] Filed: Mar. 11, 1987

Related U.S. Application Data

[63] Continuation of Ser. No. 749,632, Jun. 28, 1985, abandoned.

[30] Foreign Application Priority Data

Jul. 19, 1984 [JP] Japan ................................ 59-148648
Jul. 31, 1984 [JP] Japan ................................ 59-158656
Jul. 31, 1984 [JP] Japan ................................ 59-158657
Jul. 31, 1984 [JP] Japan ................................ 59-158658

[51] Int. Cl.$^4$ ...................... H01L 31/00; H01L 27/14
[52] U.S. Cl. ............................... 250/578; 250/211 R; 357/2; 357/30
[58] Field of Search ............. 250/211 R, 211 J, 578; 357/2, 29–32; 430/56, 57, 84, 95, 127, 128

[56] References Cited

U.S. PATENT DOCUMENTS

| | | |
|---|---|---|
| 4,345,021 | 8/1982 | Ogawa et al. |
| 4,347,436 | 8/1982 | Fukuda et al. ................ 250/578 |
| 4,390,791 | 6/1983 | Hatanaka et al. |
| 4,528,418 | 7/1985 | McGill ............................ 357/30 |
| 4,560,634 | 12/1985 | Matsuo et al. ................ 430/128 |
| 4,581,099 | 4/1986 | Fukaya et al. |
| 4,724,323 | 2/1988 | Fukaya et al. |

FOREIGN PATENT DOCUMENTS

053946 6/1982 European Pat. Off.
2102028 1/1983 United Kingdom.

OTHER PUBLICATIONS

K. Komiya et al., International Electron Devices Meeting, Washington, D.C., 7th–9th Dec. 1981, pp. 309–312, IEEE, New York, US; "A 2048-Element Contact Type Linear Image Sensor for Facsimile".

*Primary Examiner*—Edward P. Westin
*Attorney, Agent, or Firm*—Fitzpatrick, Cella, Harper & Scinto

[57] ABSTRACT

There is a photosensor comprising: a photoconductive layer containing amorphous silicon provided on a substrate in which this photoconductive layer consists of laminated films of two or more layers having different refractive indexes and the refractive index of the lowest layer of the laminated films is not larger than 3.2 for the incident light of a wavelength of 6328 Å; a pair of electrodes provided in electrical contact with the photoconductive layer; and a photo sensing section. A long size image sensor unit is constituted by a plurality of such photosensors arranged like an array, a matrix drive circuit to matrix-drive each photosensor, and a light source such as light emitting diodes of a fluorescent lamp to illuminate an original to be read. With this image sensor unit, it is possible to provide a low-cost image reading apparatus which can read an image on the original at a high speed in which: the uniformity of the characteristic of each photosensor is improved; a variation in signal between the bits is reduced; a correction circuit for such a variation is unnecessary; and the peel-off of the photoconductive layer does not occur. A method of manufacturing such photosensors is also disclosed.

17 Claims, 16 Drawing Sheets

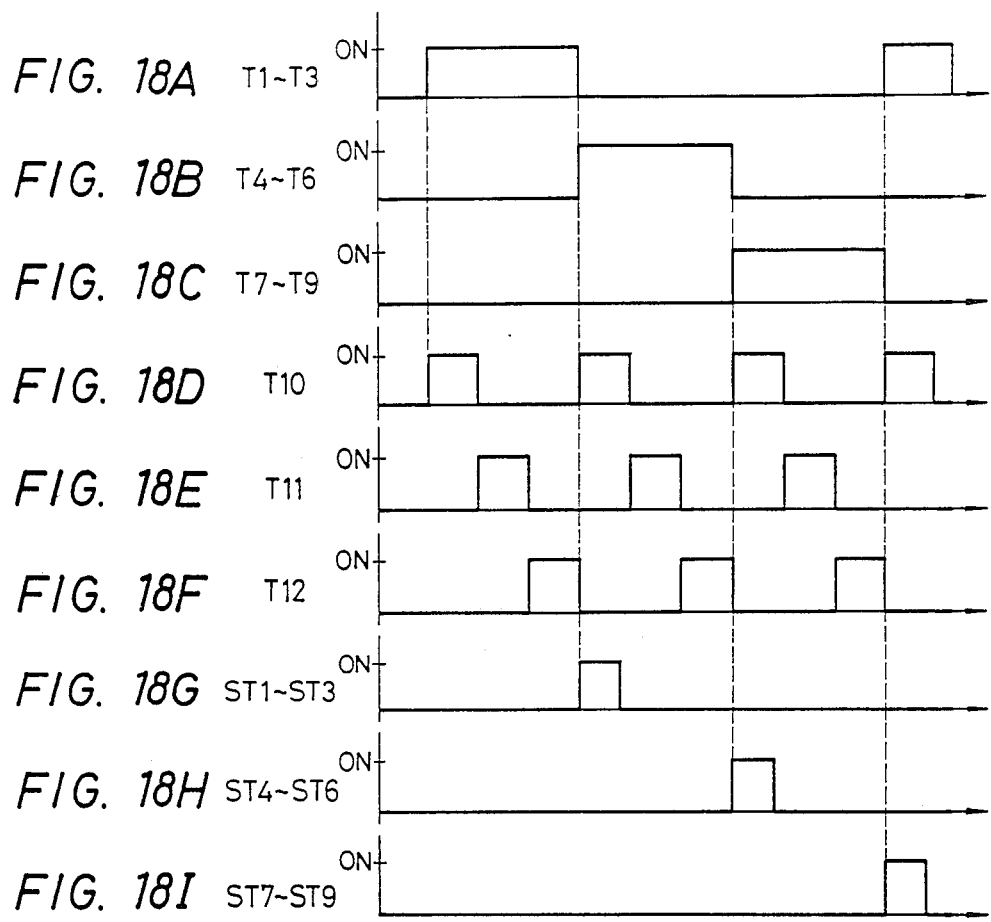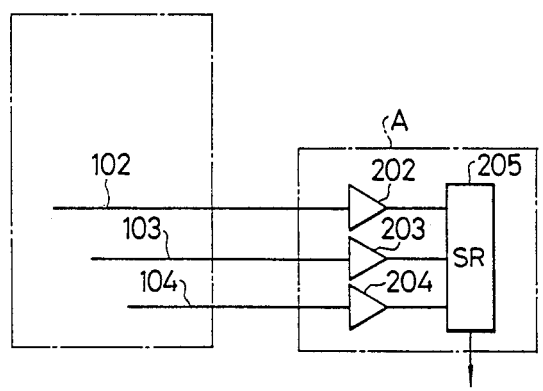

LONG SIZE IMAGE SENSOR HAVING IMPROVED CONSISTENCY AMONG INDIVIDUAL PHOTOSENSORS

This is a continuation of application Ser. No. 749,632, filed June 28, 1985, now abandoned.

BACKGROUND OF THE INVENTION

1. Field of the Invention

The present invention relates to a long size image sensor unit and photosensors for use in this sensor unit and a method of manufacturing the photosensors.

2. Description of the Prior Art

Hitherto, in a photoelectric converting apparatus which is used as a photo inputting section of an image information processing apparatus such as a facsimile, a digital copying machine, a character reading apparatus, etc., it is generally well known that a photosensor is used a photoelectric converting element. Particularly, in recent years, there has been adopted an arrangement such that photosensors are one-dimensionally arranged to form a long size line sensor and a highly sensitive image processing apparatus is constituted using this line sensor. As an example of the photosensors constituting such a long size line sensor, there can be mentioned a photoconductive type photosensor of the planar type provided with a pair of electrodes consisting of film-like metal or the like arranged on a photoconductive layer including amorphous silicon (hereinafter, referred to as a-Si (H,X)) or the like containing hydrogen atoms and halogen atoms such as fluorine atoms or the like as a photoconductive material in such a manner that these electrodes face each other so as to form a gap serving as photosensing section.

As a method of manufacturing a-Si (H,X) which constitutes such a photosensor, there are a plasma CVD method, a reactive sputtering method, an ion plating method, etc. In any of these methods, the reaction is facilitated by way of a glow discharge. However, in any of these cases, it is necessary to form the film with a relatively low discharge power to derive the high quality a-Si (H,X) film having a high photoconductivity. However, the photoconductive layer formed by using such a low discharge power has problems such that the adhesive property with a substrate consisting of a glass, ceramics or the like is insufficient and it is likely to cause peel-off of the film when performing the subsequent photolithography process or the like upon formation of the electrode.

Therefore, conventionally, to prevent the peel-off of the film, a method whereby a-Si (H,X) is deposited after the surface of the substrate is made rough has been adopted. Practically speaking, the substrate surface is preliminarily chemically etched by means of, for example, hydrofluoric acid or the like or is physically rubbed using, for instance, a brush or the like. However, such a method has the following drawbacks.

(1) In case of using a chemical such as hydrofluoric acid or the like, the apparatus in the cleaning line becomes complicated and expensive.

(2) It is difficult to control a degree of roughness of the substrate surface.

(3) Micro defects could be easily caused when the substrate surface is made rough and a variation in characteristics is likely to occur because the characteristics of the a-Si (H,X) film which is deposited on those micro defects differ.

Consequently, in case of constituting the long size image sensor using such photosensors as mentioned above, there is a large variation among respective bit signals, so that it is necessary to further provide a correction circuit to correct such a variation and this results in an increase in cost.

SUMMARY OF THE INVENTION

It is an object of the present invention to provide a long size image sensor unit which can solve the above-mentioned conventional drawbacks.

Another object of the invention is to provide a long size image sensor of a low cost in which a uniformity of the characteristics of the respective photosensors in the long size image sensor array is improved and thereby reducing a variation in signal between bits and eliminating the need to use a correction circuit.

Still another object of the invention is to provide long size image sensor unit in which a uniformity of the characteristics of the respective photosensors in the photosensor array is improved and thereby enabling the matrix driving in an image reading apparatus to be simply and accurately performed.

Still another object of the invention is to provide an image reading apparatus in which uniformity of the characteristics of the respective photosensors in the photosensor array is improved and high speed reading can be performed.

Still another object of the invention is to provide photosensors having uniform and good performances which can be manufactured at a low cost and in which the peel-off of the film of the photoconductive layer or the like is difficult to occur in consideration of the above-mentioned conventional technology.

Still another object of the invention is to uniformly manufacture the foregoing photosensors at a low cost.

These and other objects are achieved by providing a long size image sensor unit comprising:

a photo sensor array consisting of a plurality of photosensors arranged in an array, each of these photosensors having a photoconductive layer including amorphous silicon provided on a substrate in which this photoconductive layer consists of laminated films of two or more layers having different refractive indexes and the refractive index of the lowest layer of these laminated films is not larger than 3.2 for the light of a wavelength of 6328 Å, a pair of electrodes provided in electrical contact with the photoconductive layer, and a photo sensing section; and a light source for illuminating an original.

In another aspect of the invention, a photosensor is provided comprising:

a photoconductive layer including amorphous silicon provided on a substrate in which this photoconductive layer consists of laminated films of two or more layers having different refractive indexes and the refractive index of the lowest layer of these laminated films is not larger than 3.2 for the light of a wavelength of 6328 Å;

a pair of electrodes provided in electrical contact with the photoconductive layer; and a photo sensing section.

BRIEF DESCRIPTION OF THE DRAWINGS

FIGS. 18A to 18I show timing charts;

FIG. 19 is a diagram showing a partial modified form of FIG. 17.

DETAILED DESCRIPTION OF THE PREFERRED EMBODIMENTS

Practical embodiments of the present invention will now be described hereinbelow.

In this specification, the lowest layer in a photoconductive layer constituting a photosensor may be also referred to as an a-Si (H,X) under layer, while one or a plurality of layers on or over this under layer may be also referred to as a-Si (H,X) layers.

Figure 2:
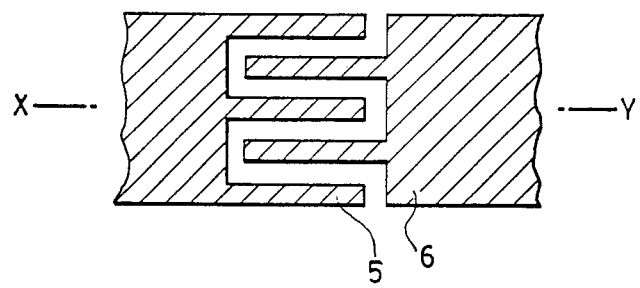
FIG. 2 is a partial plan view of a photosensor of the invention.
Figure 3:
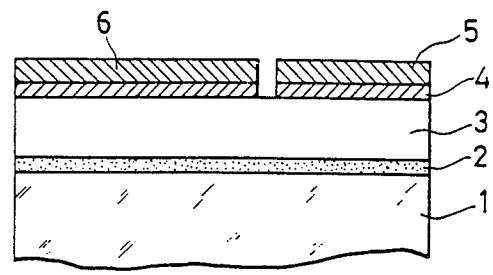
FIG. 3 is a cross sectional view taken along the line X-Y in FIG. 2.

FIG. 2 is a partial perspective view of a photosensor in one embodiment of a long size image sensor unit of the present invention. FIG. 3 is a cross sectional view taken along the line X-Y in FIG. 2. In the diagrams, a reference numeral 1 denotes a substrate. 2 is an a-Si (H,X) under layer and 3 is an a-Si (H,X) layer, and these layers constitute the photoconductive layer. A numeral 4 is an n+ layer consisting of a-Si (H,X) which serves as an ohmic contact layer; 5 is a common electrode; and 6 is an individual electrode.

As a suitable substrate for use in the photosensor of the present invention, it is possible to use #7059 or #7740 made by Corning Glass Works Co., Ltd., SCG made by Tokyo Applied Chemistry Co., Ltd., a glass such as a quartz glass or the like, or a ceramic such as a partial glaze ceramic or the like, etc.

The photoconductive layer of the photosensor of the present invention consists of a plurality of laminated films and the lowest layer, namely, the layer adjacent to the substrate has a refractive index of not larger than 3.2. Such a layer is formed by properly setting the manufacturing condition when the glow discharge is performed by way of a method such as a plasma CVD method, a reactive sputtering method, an ion plating method, or the like.

In this invention, it is desirable that a layer having a high photoconductivity is included in the a-Si (H,X) layer.

In the method of manufacturing the photosensors of the present invention, when the a-Si (H,X) layer is formed after the a-Si (H,X) under layer was formed, a power source is once cut off to stop the glow discharge and thereafter the power source is again turned on, and then the glow discharge can be performed by a desired discharge power. However, it is preferable to continuously perform the glow discharge by simply switching the set value of the discharge power without turning off the power source.

The refractive index of the a-Si (H,X) layer 3 is larger than 3.2, preferably, about 3.4. The photoconductive layer is formed by way of the plasma CVD method, reactive sputtering method, ion plating method, or the like. In particular, it is formed by the plasma CVD method. In the photoconductive layer formed in this way, the stress is generated due to hydrogen atoms or/and halogen atoms which are taken into the layer upon formation of the layer. If this stress is too large, the adhesive property with substrate deteriorates, so that the peel-off of the film is likely to occur. The magnitude of the stress of the photoconductive layer can be controlled by appropriately setting the conditions upon formation of the layer, for instance, the discharge power of the glow discharge, temperature of the substrate, composition of the material gases, and pressures of the material gases. As the a-Si (H,X) under layer 2 adjacent to the substrate 1, for example, the layer having a small stress is formed by performing the glow discharge by use of a relatively large discharge power, thereby making it possible to keep the good adhesive property with the substrate 1.

On the other hand, it is generally known that there is a large correlation between the stress of the photoconductive layer and the refractive index of this layer and that the refractive index is small when the stress is small. In addition, it is also known that it is necessary to perform the glow discharge by a relatively low discharge power to obtain an excellent photo conductivity of the photoconductive layer.

Accordingly, it is desirable that the a-Si (H,X) under layer 2 having a relatively small refractive index of, for example, not larger than 3.2 is first formed on the substrate 1 by performing the glow discharge by a relatively large discharge power, and thereafter the a-Si (H,X) layer 3 having a comparatively large refractive index of, for instance, about 3.4 and a high photo conductivity is formed by executing the glow discharge by a comparatively small discharge power.

The common electrode 5 and individual electrode 6 consist of the conductive films such as, for example, aluminum or the like.

Figure 20:
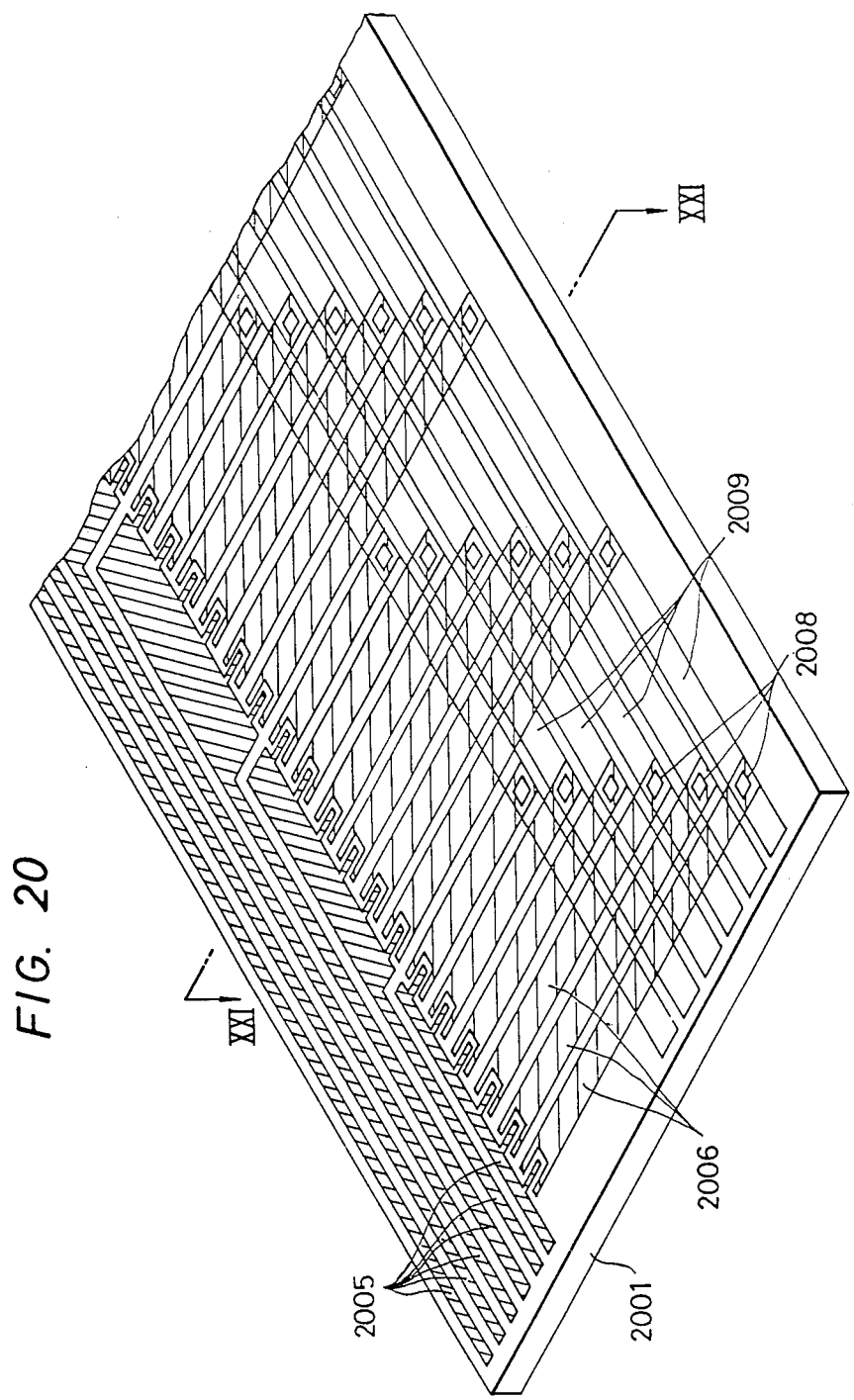
FIG. 20 is a partial perspective view of still another photosensor array of the apparatus of the invention.
Figure 21:
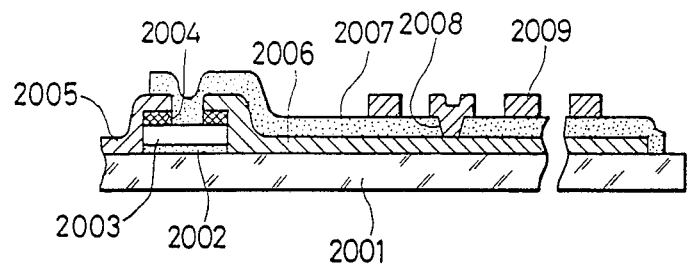
FIG. 21 is a cross sectional view taken along the line XXI—XXI in FIG. 20.

FIG. 20 is a partial perspective view of a photosensor array in a suitable embodiment of an image reading apparatus of the present invention. FIG. 21 is a cross sectional view taken along the line XXI—XXI in FIG. 20. In the diagram, a reference numeral 2001 denotes a substrate. A numeral 2002 is an a-Si (H,X) under layer and 2003 is an a-Si (H,X) layer, and these layers constitute a photo conductive layer. A numeral 2004 is an n+ layer consisting of a-Si (H,X) which serves as an ohmic contact layer; 2005 is a block common electrode; 2006 an individual electrode; 2007 an insulation layer; 2008 a through hole; and 2009 an upper electrode of a matrix wiring.

The insulation layer 2007 is a film consisting of an insulative inorganic material such as SiN:H or the like or a film consisting of various kinds of insulative organic resin materials.

The upper electrode 2009 consists of a conductive film such as Al or the like similar to the common electrode 2005 and individual electrode 2006.

The other constitution is substantially the same as the photosensor shown in FIGS. 2 and 3.

Figure 26:
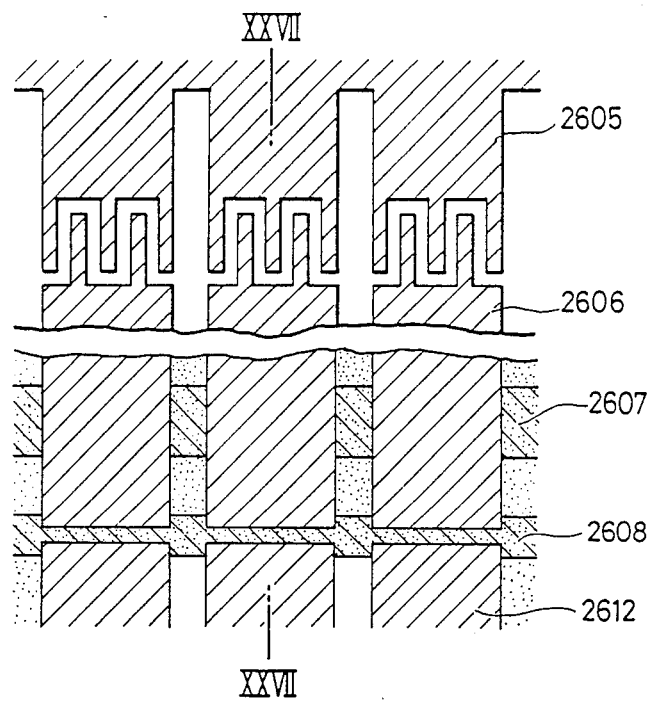
FIG. 26 is a partial plan view of still another photosensor array of the apparatus of the invention.
Figure 27:
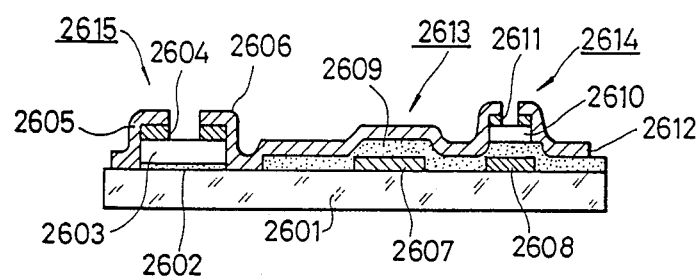
FIG. 27 is a cross sectional view taken along the line XXVII—XXVII in FIG. 26.
Figure 28:
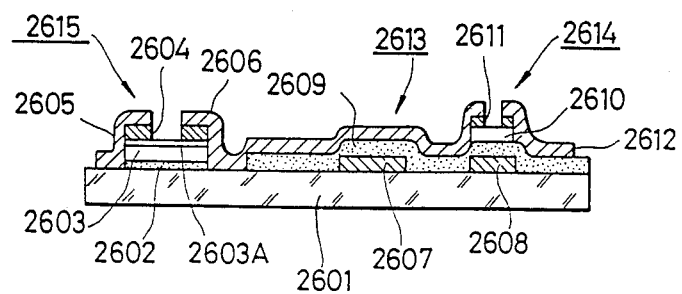
FIG. 28 is a cross sectional view of still another photosensor array of the invention.

FIG. 26 is a partial plan view of a photosensor array in still another suitable embodiment of the image reading apparatus of the invention. FIG. 27 is a cross sectional view taken along the line XXVII—XXVII in FIG. 26. In the diagrams, a reference numeral 2601 denotes a substrate. A numeral 2602 is an a-Si (H,X) under layer and 2603 is an a-Si (H,X) layer, and these layers constitute a photoconductive layer. A numeral 2604 is an n+ layer consisting of a-Si (H,X) which serves as an ohmic contact layer; 2605 is a common electrode; 2606 an individual electrode; 2607 and 2608 conductive layers; 2609 an insulation layer; 2610 a semiconductor layer; 2611 an n+ layer consisting of a-Si (H,X) which serves as an ohmic contact layer; and 2612 a signal take-out line. In this array, a capacitor section 2613 to accumulate charges and a switching transistor section 2614 to take out the charges stored in the capacitor section 2613 are constituted. A numeral 2615 is a photoelectric converting section.

Each of the conductive layers 2607 and 2608 consists of a conductive film such as, for example, Cr or the like. The insulation layer 2609 is an insulative inorganic material film such as SiN:H or the like or various kinds of insulative organic resin films. The signal take-out line 2612 consists of a conductive film such as, for instance, Al or the like. The other constitution is substantially the same as the photosensor shown in FIGS. 2 and 3.

The present invention will then be explained in detail hereinbelow with respect to Examples.

EXAMPLE 1

Figure 1:
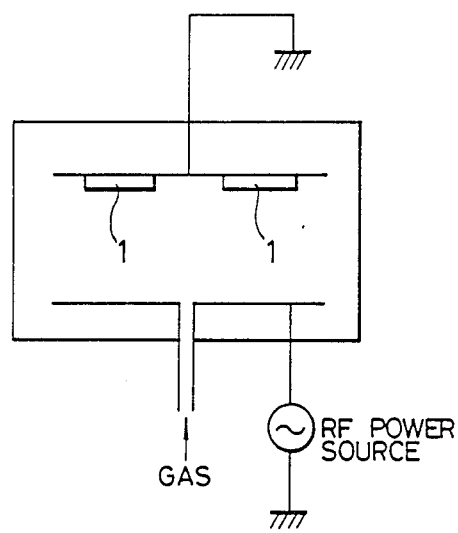
FIG. 1 is a schematic arrangement diagram of an apparatus which is used in a manufacturing method of the present invention.

Ordinary cleaning was performed using a neutral detergent or an organic alkali system detergent for the glass substrate (#7059 made by Corning Glass Works Co., Ltd.) of which both sides have already been polished. Next, the glass substrate 1 was set in the glow discharge decomposition apparatus of the capacitive coupling type as shown in FIG. 1 and was maintained at 230° C. under the exhaust vacuum of $1 \times 10^{-6}$ Torr. Then, the epitaxial grade pure SiH$_4$ gas (Komatsu Electronics Co., Ltd.) was allowed to flow into this apparatus at a flow rate of 10 SCCM and the gas pressure was set to 0.07 Torr. Thereafter, the glow discharge was performed using a high frequency power source of 13.56 MHz for two minutes at the input voltage of 2.0 kV and using the RF (Radio Frequency) discharge power of 120 W, and the amorphous silicon (hereinafter, referred to as a-Si:H) under layer containing hydrogen atoms having a thickness of about 400 Å was formed. Then, the input voltage was immediately reduced to 0.3 kV and the glow discharge was performed for 4.5 hours using the discharge power of 8 W to form the a-Si:H layer of a thickness of about 0.8μ.

Subsequently, the n+ layer (having a thickness of about 0.15μ) serving as the ohmic contact layer was deposited by way of the discharge power of 30 W using the mixed gases, as a raw material, in which SiH$_4$ diluted to 10% by H$_2$ and PH$_3$ diluted to 100 ppm by H$_2$ were mixed at a mixture ratio of 1:10. Next, Al was deposited to have a thickness of 0.3μ by way of an electron beam evaporation method to form the conductive layer.

Subsequently, a photo resist pattern of a desired shape was formed using the positive type photo resist (AZ-1370 made by Shiplay Co., Ltd.). Thereafter, the conductive layer in the exposed portion was removed by the liquid in which phosphoric acid (aqueous solution of 85 volume %), nitric acid (aqueous solution of 60 volume %), glacial acetic acid, and water were mixed at the volume ratio of 16:1:2:1 (hereinafter, this mixed liquid is referred to as an "ethcing liquid 1"). Next, the n+ layer in the exposed portion was removed by performing the dry etching using the RF discharge power of 120 W and at the gas pressure of 0.07 Torr by the CF$_4$ gas due to a plasma etching method using the plane parallel plate type apparatus. Then, the photo resist was peeled off.

FIGS. 2 and 3 show the photosensor having an arrangement similar to the planar type photosensor obtained in this way.

On the other hand, for the purpose of comparison, the planar type photosensor (hereinafter, this sensor is abbreviated as a "comparison photosensor A") was manufactured in a similar manner as the above-mentioned processes excluding that the surface of the same glass substrate as the foregoing one was treated for thirty seconds by using the liquid in which hydrofluoric acid (aqueous solution of 49 volume %), nitric acid (aqueous solution of 60 volume %) and acetic acid were mixed at the volume ratio of 1:5:40 and that the a-Si:H under layer is not formed.

With respect to the above-mentioned two kinds of photosensors, the values of the photo currents that were derived by allowing the light of $\lambda_{max} = 565$ nm to enter from the side of the glass substrate 1 under the same conditions were compared, so that substantially the same values were derived in both cases. It has been found from this result that the characteristic of the photo current was not degraded due to the existence of the a-Si:H under layer 2 in the photosensor of the present invention.

Next, the durability tests by way of the heat cycle were performed under the same conditions with regard to the foregoing two kinds of photosensors. Thus, it has been found that peel-off of the film did not likewise occur and a sufficient adhesive property was preserved.

EXAMPLE 2

In the photosensor manufacturing processes in the Example 1, the processes similar to Example 1 were performed excluding that the glow discharge was performed under the conditions based on the combinations shown in the following Table 1 with respect to the discharge power and discharge time upon formation of the a-Si:H under layer 2.

TABLE 1

| Discharge power (W) | 80 | 50 | 30 | 8 | 4 |
|---|---|---|---|---|---|
| Discharge time (minutes) | 3 | 4 | 6 | 18 | 40 |

Thus, the objective photosensors could be obtained without causing peel-off of the film in the cases where the discharge power is 80 W and 50 W. However, in the cases where the discharge power is 30 W, 8 W and 4 W, the peel-off of the film occurred during the photo lithography process (including the cleaning by the ultrasonic cleaning apparatus) using the photo resist AZ-1370, so that the objective good photosensors cannot be derived.

EXAMPLE 3

Figure 4:
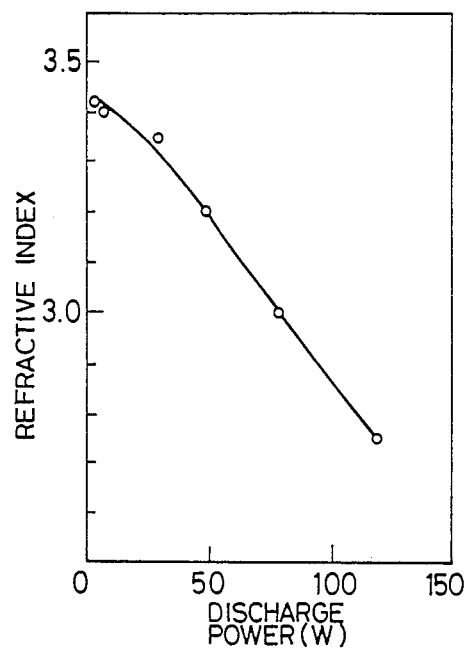
FIGS. 4 and 5 are graphs showing the characteristics of an under layer.

Similarly to Examples 1 and 2, the substrate 1 was fetched after the formation of the a-Si:H under layer 2. Then, the refractive indexes of the a-Si:H under layer 2 formed on the substrate 1 were measured. FIG. 4 shows the relation between the discharge power of the glow discharge and the refractive index of the a-Si:H under layer 2.

Figure 5:
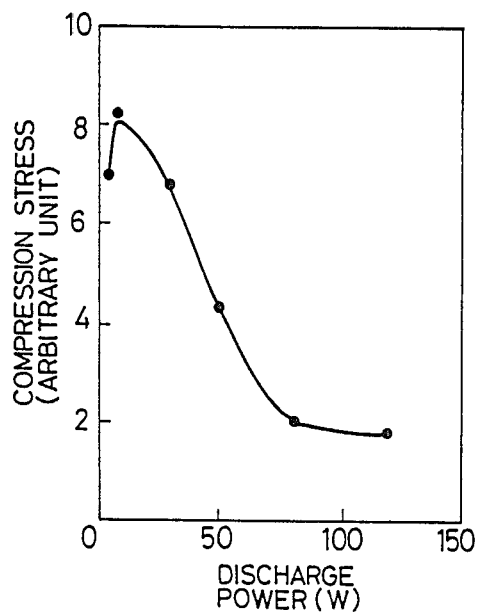

The adhesive property of the substrate and photoconductive layer is concerned with the discharge power of the glow discharge in formation of the film. It is considered that film peel-off is caused by the whole synthesized stress of the intrinsic stress which is induced depending on the internal structure of the thin film and the internal stress depending on the differences in thermal expansion coefficient between the photoconductive layer and the substrate. Therefore, the whole stress of the a-Si:H under layer 2 formed on the substrate 1 was measured. FIG. 5 shows the relation between the discharge power of the glow discharge and the whole stress of the a-Si:H under layer 2. The stress appears as a compression stress and exhibits the maximum value when the discharge power is near 10 W. But the stress becomes small with an increase in discharge power. It is considered that a reason why the stress decreases as the discharge power increases is mainly because the voids which increase in the film generate the tensile stress and set off the compression stress.

As described above, the photoconductivity of the photoconductive layer relates to the discharge power in formation of the film and it is necessary to perform the deposition by a relatively low discharge power to derive the desired photoconductive characteristic. Therefore, the a-Si (H,X) layer 3 in the foregoing Examples 1 and 2 was deposited by a comparatively low discharge power.

It will be appreciated from the above description that the a-Si:H under layer 2 of the photosensor according to the present invention has a function as a stress relaxation layer and provides the effect to improve the adhesive property between the substrate and the photoconductive layer. In addition, in the photosensor according to the invention, it is desirable that the thickness of the a-Si:H under layer 2 is not so thick to derive the good photoconductive characteristic in case of using the under layer 2 by illuminating the light from the side of the substrate 1, for example, it is preferable to set the thickness to not larger than 1000 Å.

On the contrary, in case of allowing the light to enter from the side opposite to the substrate 1, there is no need to consider the influence on the photoelectric conversion characteristic due to the light absorption in the a-Si:H under layer 2; therefore, the a-Si:H under layer 2 may be fairly thick.

EXAMPLE 4

In the photosensor manufacturing processes in Example 1, the processes similar to Example 1 were performed excluding that the glow discharge was performed for 25 minutes by raising the discharge power to 80 W after the formation of the a-Si (H,X) layer 3 and further the a-Si:H layer was formed.

Figure 6:
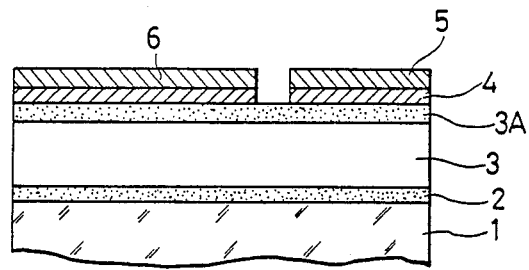
FIG. 6 is a partial cross sectional view of another photosensor of the present invention.

FIG. 6 is a partial cross sectional view of the planar type photosensor obtained in this way and shows the portion similar to FIG. 3. In FIG. 6, the similar parts and components as those shown in FIG. 3 are designated by the same reference numerals and a numeral 3A denotes the a-Si:H layer. The thickness of the a-Si:H layer 3A is 0.3μ and the forming speed per unit thickness of the layer 3A is remarkably higher than the forming speed per unit thickness of the a-Si (H,X) layer 3 because the discharge power was raised.

In the photosensor derived according to this Example, the photoconductive layer is constituted by the a-Si:H under layer 2, a-Si (H,X) layer 3 and a-Si:H layer 3A. According to the photosensor of this Example, the photo current obtained was larger than that in Example 1 with the aid of the increase of the thickness of the a-Si:H layer.

EXAMPLE 5

In the photosensor manufacturing processes in Example 1, the processes similar to Example 1 were carried out excluding that the temperature of the substrate was maintained at 70° C. in formation of the a-Si:H under layer 2 and the glow discharge was performed for 15 minutes using the discharge power of 8 W.

The substrate 1 was taken out when the a-Si:H under layer 2 was formed under the same condition and the refractive index of the a-Si:H under layer 2 was measured, so that it was 3.10.

The photosensor derived in this Example was good similarly to the photosensor obtained in Example 1.

EXAMPLE 6

In the photosensor manufacturing processes in Example 1, the processes similar to Example 1 were performed excluding that SiH$_4$ duluted to 5% by H$_2$ was used as a raw material gas in formation of the a-Si:H under layer 2 and the glow discharge was performed for ten minutes using the discharge power of 30 W.

The substrate was taken out when the a-Si:H under layer 2 was formed under the same condition and the refractive index of the a-Si:H under layer 2 was measured, so that it was 3.02.

The photosensor derived in this Example was good similarly to the photosensor obtained in Example 1.

EXAMPLE 7

In the photosensor manufacturing processes in Example 1, the processes similar to Example 1 were performed excluding that the gas pressure was set to 0.30 Torr in formation of the a-Si:h under layer 2 and the glow discharge was performed for five minutes using the discharge power of 50 W.

The substrate was taken out when the a-Si:H under layer 2 was formed under the same condition and the refractive index of the a-Si:H under layer 2 was measured, so that it was 3.12.

The photosensor derived in this Example was good similarly to the photosensor obtained in Example 1.

EXAMPLE 8

In a similar manner as Example 1, the photosensor array was manufactured by arranging 864 photosensors like an array on the same substrate.

Figure 7:
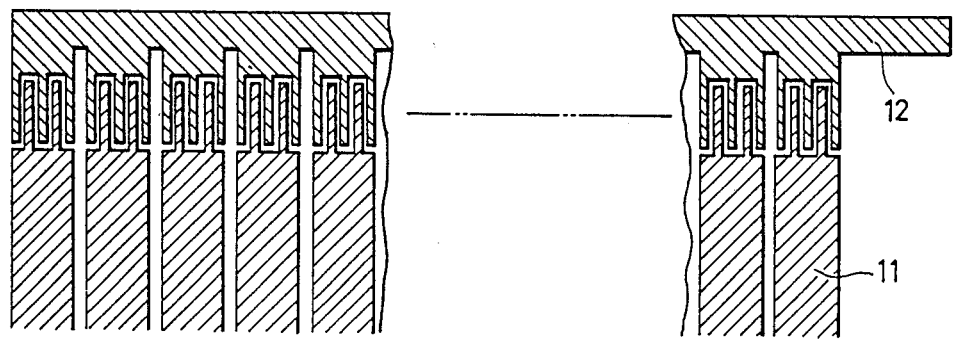
FIG. 7 is a partial plan view of a photosensor array according to the present invention.

This array can be easily manufactured by properly setting the mask in the photo lithography process. FIG. 7 shows a schematic partial plan view of the long size photosensor array derived in this way. In FIG. 7, a reference numeral 11 denotes an individual electrode and 12 is a common electrode. The density of the photo sensing surface of this long size photosensor array is 8 bits/mm and has the length equal to the width of the A6 size.

Uniformites of the photo current and dark current between the bits of the photosensor array derived in this Example were measured. The result is shown in FIG. 8.

On the other hand, for the purpose of comparison, by way of the method whereby the substrate acid treatment process is performed but no under layer exists, similarly to the comparison photosensor A described in Example 1, the uniformities of the photo current and dark current between the bits of the long size photosensor array manufactured by arranging 864 photosensors like an array on the same substrate were measured. The result is shown in FIG. 9.

Figure 8:
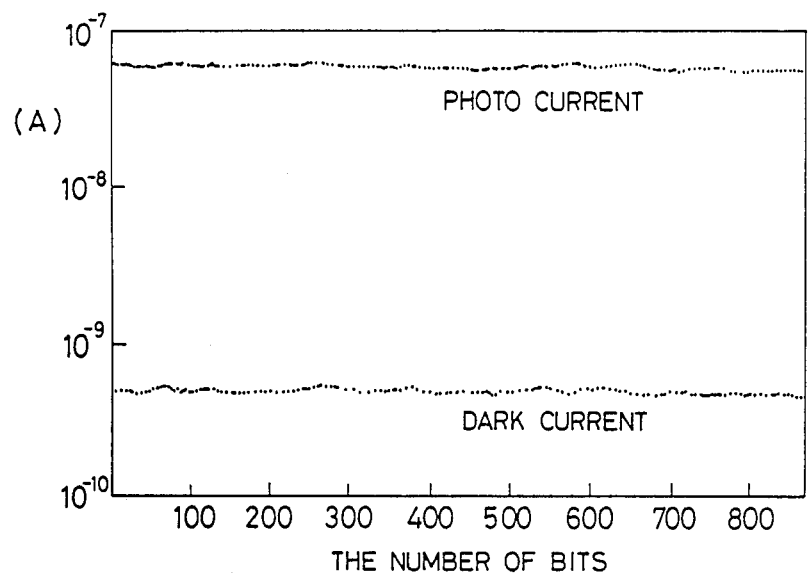
FIGS. 8 and 9 are graphs showing the characteristics of the photo current and dark current of the photosensor array in FIG. 7.
Figure 9:
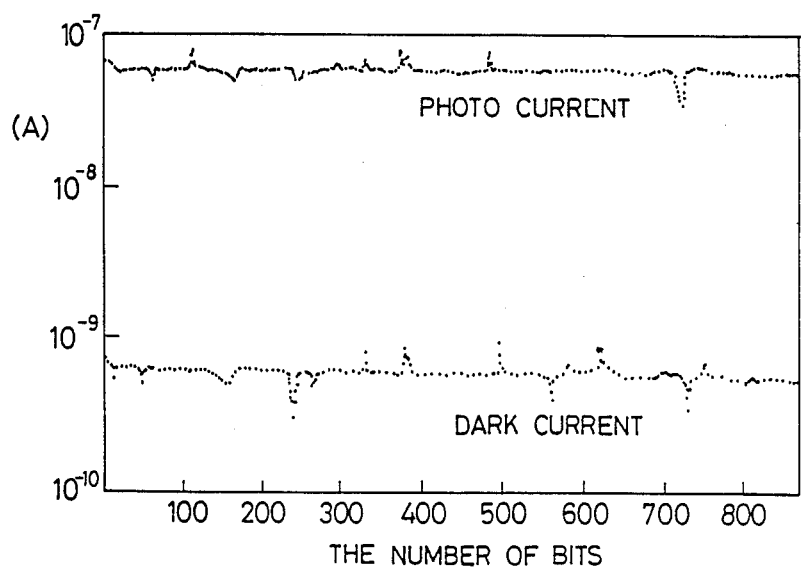

From the comparison between FIGS. 8 and 9, in the photosensor of the invention, it will be understood that no micro defect exists on the substrate and the a-Si:H under layer functions as a stress relaxation layer, so that the uniformity of the photoconductive characteristic is extremely good.

EXAMPLE 9

It had been tried to divide the long size photosensor array of 864 bits such as derived in Example 8 into 27 blocks each consisting of 32 bits and to matrix drive them.

Practically speaking, the long size photosensor array was manufactured by way of the processes similar to Example 8 and then a polyimide resin (PIQ made by Hitachi Chemical Co., Ltd.) was coated on the whose surface of this array and was baked. Thereafter, a pattern of a desired shape was formed using the negative type photo resist (OMR-83 made by Tokyo Applied Chemical Co., Ltd.) and then the PIQ in the unnecessary portions was removed by use of the polyimide resin etching liquid (PIQ Etchant made by Hitachi Chemical Co., Ltd.) and the OMR-83 was peeled off. Subsequently, this array was cured at 300° C. for one hour under the nitrogen atmosphere, thereby forming the insulation layer and through holes for the matrix wiring. Next, Al of the thickness of 2μ was deposited due to an electron beam evaporation method and the upper electrodes of the matrix wiring were formed using the positive type photo resist AZ-1370 and etching liquid 1.

Figure 10:
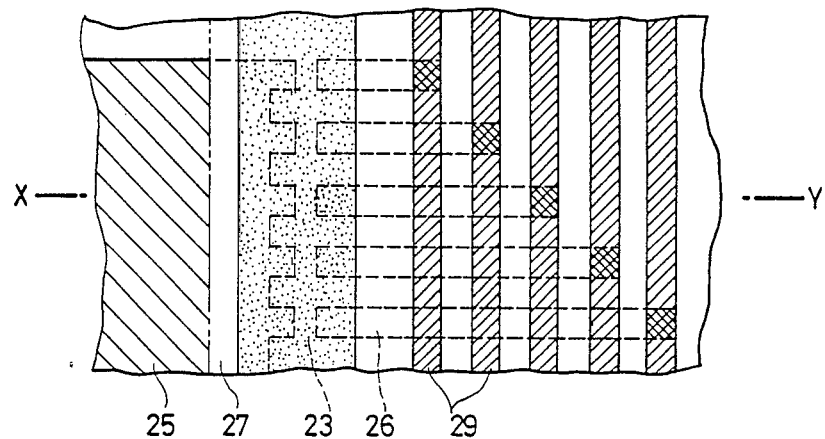
FIG. 10 is a partial plan view of the matrix wiring section.
Figure 11:
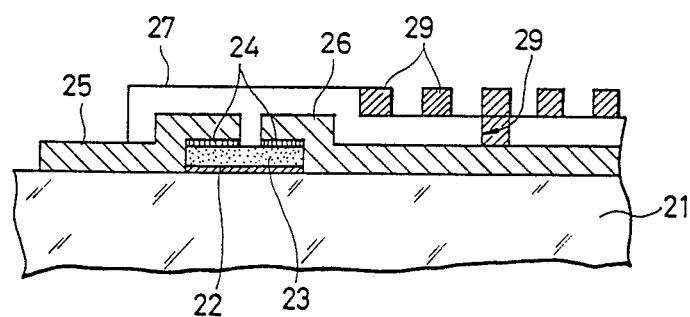
FIG. 11 is a cross sectional view taken along the line X-Y in FIG. 10.

FIG. 10 shows a schematic partial plan view of the matrix wiring section of the long size photosensor array derived as mentioned above. FIG. 11 shows a cross sectional view taken along the line X-Y in FIG. 10. In FIGS. 10 and 11, a numeral 21 denotes a substrate; 22 is an a-Si:H under layer; 23 an a-Si (H,X) layer; 24 an n+ layer; 25 a common electrode; 26 an individual electrode; 27 an insulation layer; 28 a through hole; and 29 an upper electrode of the matrix wiring.

Figure 12:
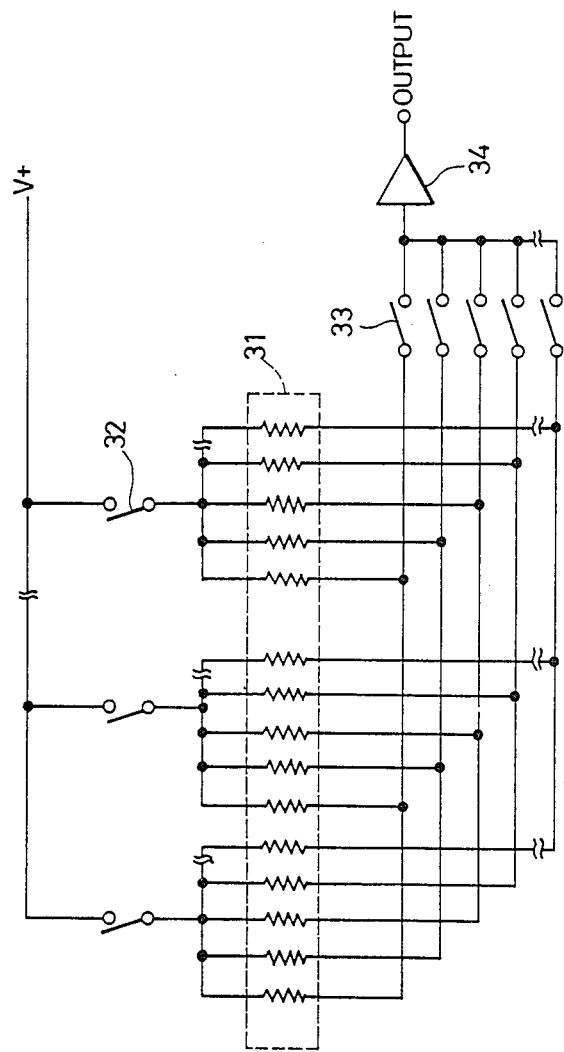
FIG. 12 is a diagram showing a matrix drive circuit.

FIG. 12 shows a drive circuit diagram to matrix drive the long size photosensor array having the pitch of 8 bits/mm and the width of the A6 size which was derived in this way. In FIG. 12, a numeral 31 indicates a photoconductive layer of the photosensor; 32 is a block selecting switch; 33 a common switch; and 34 an amplifier.

Figure 13:
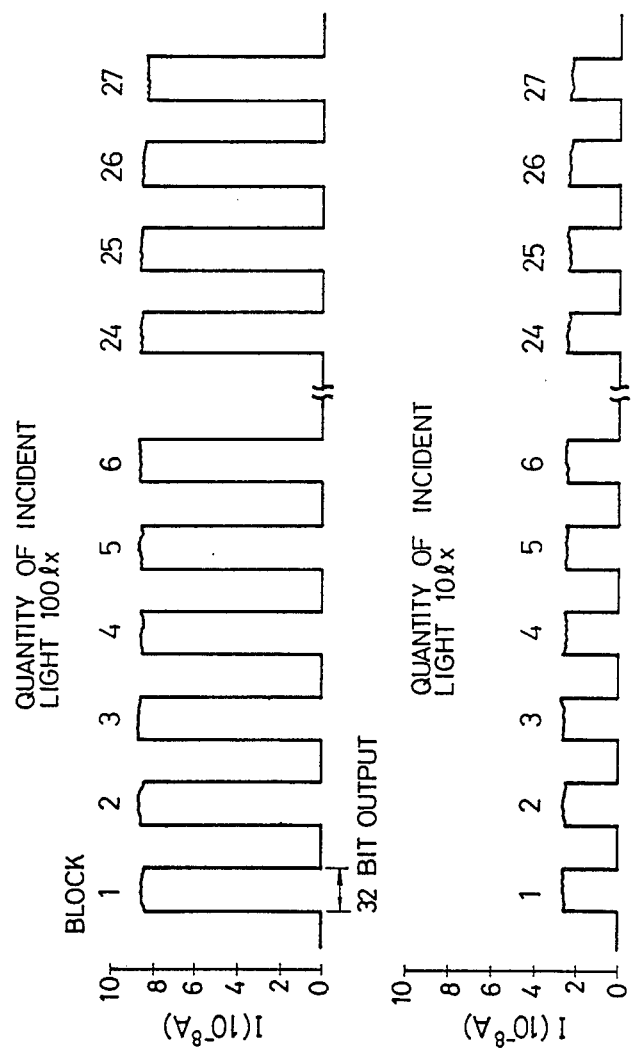
FIG. 13 shows graphs of the output photo current in the circuit of FIG. 12.

Upon completion of the matrix driving of the long size array in such a manner as explained above, the uniformity of the output photo current between the bits was measured 100 μsec after the voltage had been applied. The result is shown in FIG. 13. It will be understood from FIG. 13 that the output photo current of each bit exhibits extremely good uniformity and the signal can be sufficiently read out by the matrix driving.

Figure 14:
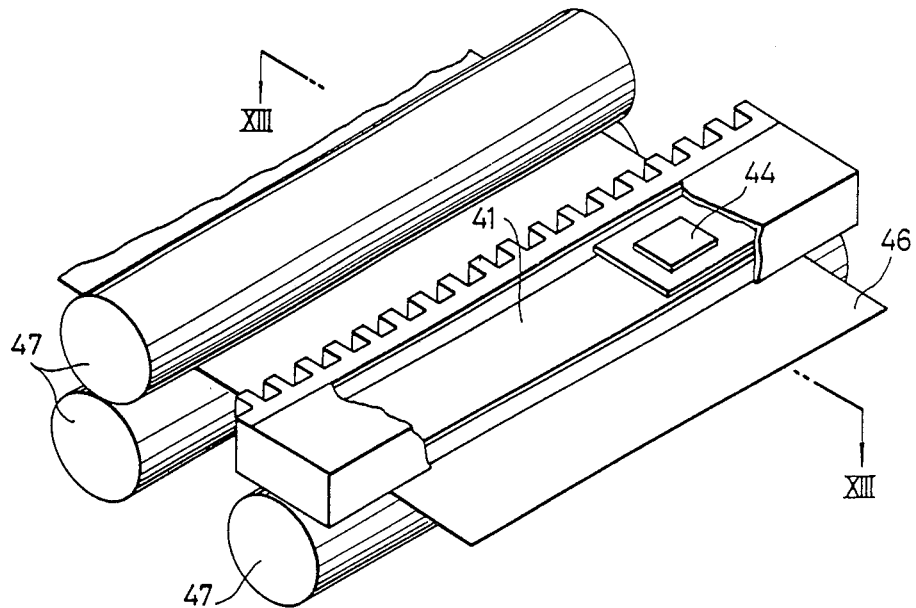
FIG. 14 is a perspective view of a long size image sensor unit of the present invention with a part cut away.
Figure 15:
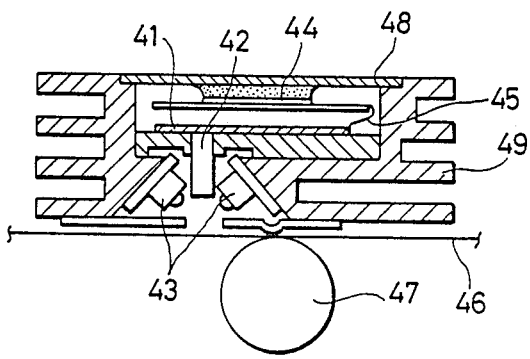
FIG. 15 is a cross sectional view taken along the line XIII—XIII in FIG. 14.

FIG. 14 shows a perspective view of the image sensor unit used in this Example with a part cut away. FIG. 15 is a cross sectional view taken along the line XIII—XIII in FIG. 14. In the diagrams, a numeral 41 denotes a substrate of the photosensor array. A fiber lens array 42 is provided under the substrate 41 and light emitting diode (LED) arrays 43 are arranged on both sides of the array 42. A driving IC 44 is electrically connected with the matrix wiring section on the substrate 41 by means of a flexible conductive material 45. A numeral 46 denotes a read original; 47 indicates feed rollers to feed this original; 48 a radiating fin; and 49 a radiating plate. The driving IC 44 is thermally connected to the radiating plate 49. The photosensor array, fiber lens array 42 and LED array 43 are arranged in parallel with each other.

EXAMPLE 10

Figure 16:
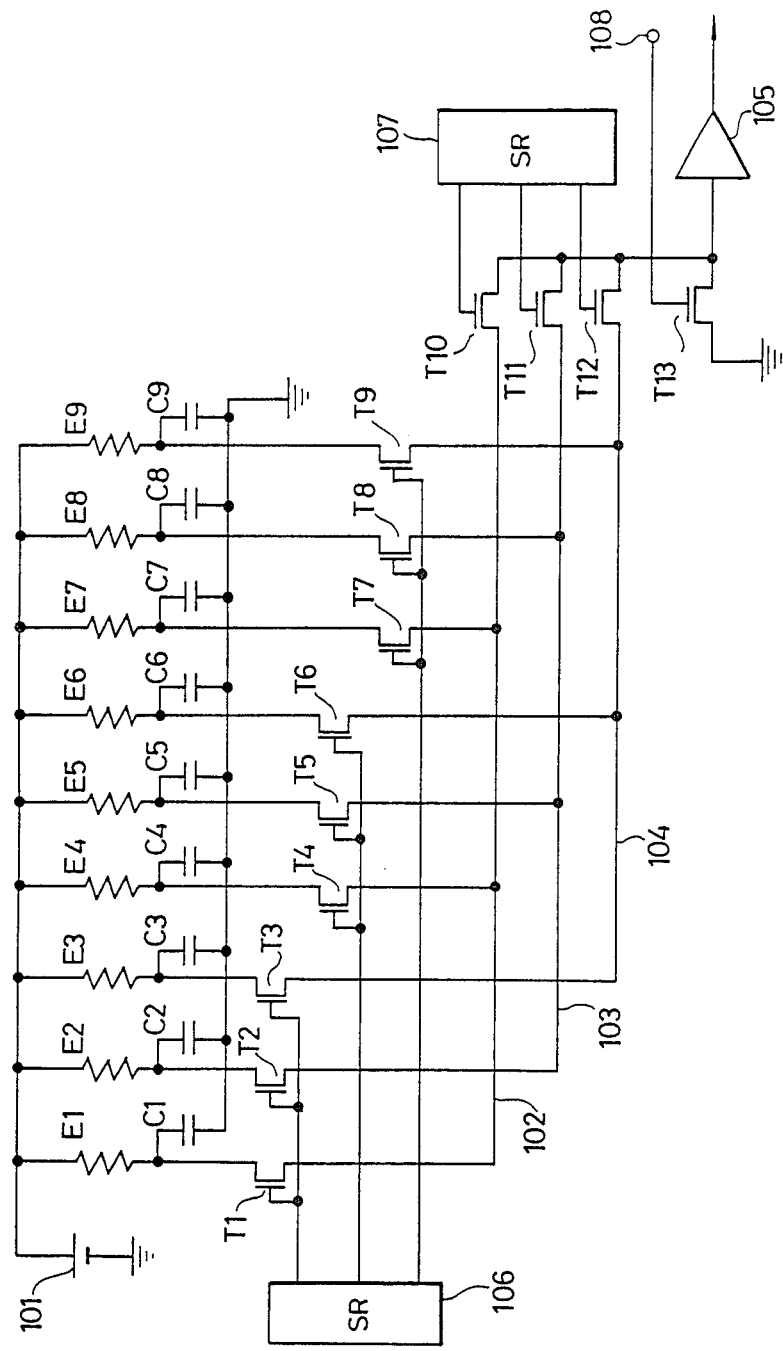
FIGS. 16 and 17 are circuit diagrams each showing an example of a circuit of the long size image sensor unit of the invention.

The long size image sensor unit was constituted using the photosensor array derived in Example 9. FIG. 16 is a circuit diagram of this unit.

In FIG. 16, each three of photosensors $E_1$ to $E_9$ constitute one block and three blocks constitute the photosensor array. The same shall apply to capacitors $C_1$ to $C_9$ and switching transistors $T_1$ to $T_9$ respectively corresponding to the photosensors $E_1$ to $E_9$.

One electrode (common electrode) of each of the photosensors $E_1$ to $E_9$ is connected to a power source 101 and the other electrode (individual electrode) is grounded through each of the capacitors $C_1$ to $C_9$.

The individual electrodes having the same order in each block of the photosensors $E_1$ to $E_9$ are connected to one of common lines 102 to 104 through the respective switching transistors $T_1$ to $T_9$.

Explaining in detail, the first switching transistors $T_1$, $T_4$ and $T_7$ in each block are connected to the common line 102; the second switching transistors $T_2$, $T_5$ and $T_8$ in each block are connected to the common line 103; and the third switching transistors $T_3$, $T_6$ and $T_9$ in each block are connected to the common line 104, respectively.

The common lines 102 to 104 are connected to an amplifier 105 through switching transistors $T_{10}$ to $T_{12}$, respectively.

Gate electrodes of the switching transistors $T_1$ to $T_9$ are commonly connected on a block unit basis and are connected to parallel output terminals of a shift register 106, respectively. High level signals are sequentially outputted at predetermined timings from the parallel output terminals of the shift register 106, so that the switching transistors $T_1$ to $T_9$ are sequentially turned on on a block unit basis.

In addition, respective gate electrodes of the switching transistors $T_{10}$ to $T_{12}$ are connected to parallel output terminals of a shift register 107. High level signals are sequentially outputted at predetermined timings from these parallel output terminals, so that the switching transistors $T_{10}$ to $T_{12}$ are sequentially turned on.

Further, the commonly connected terminals of the switching transistors $T_{10}$ to $T_{12}$ are grounded through a switching transistor $T_{13}$ for a discharge. A gate electrode of the switching transistor $T_{13}$ is connected to a terminal 108.

The operation of a conventional image reading apparatus having such an arrangement will now be simply described.

When the light enters the photosensors $E_1$ to $E_9$, charges are accumulated into the capacitors $C_1$ to $C_9$ from the power source 101 in accordance with the magnitude of this light.

Subsequently, the high level signals are sequentially outputted from the shift registers 106 and 107 at the respective timings. It is now assumed that the high level signals are outputted from the first parallel output terminals of both of those shift registers.

In this case, the switching transistors $T_1$ to $T_3$ in the first block and the switching transistor $T_{10}$ connected to the common line 102 are turned on, so that the charges stored in the capacitor $C_1$ are inputted into the amplifier 105 through the switching transistor $T_1$, common line 102 and switching transistor $T_{10}$. These charges are outputted as image information.

When the charges stored in the capacitor $C_1$ are read out, the high level signal is supplied to the terminal 108, so that the switching transistor $T_{13}$ is turned on. Thus, the residual charges in the capacitor $C_1$ are completely discharged through the switching transistor $T_1$, common line 102, switching transistor $T_{10}$, and switching transistor $T_{13}$.

Subsequently, the shift register 107 is sequentially shifted with the first parallel outputs of the shift register 106 held at a high level, thereby allowing the switching transistors $T_{11}$ and $T_{12}$ to be sequentially turned on. In this way, the above-mentioned reading and discharging operations are performed with regard to the capacitors $C_2$ and $C_3$, thereby sequentially reading out the information stored in these capacitors.

Upon completion of the read-out of the information in the first block, the shift register 106 is sequentially shifted and the information in the second and third blocks is read out in a similar manner as above.

As described above, the information accumulated in the capacitors $C_1$ to $C_9$ is serially read out and outputted as image information from the amplifier 105.

The image reading apparatus shown in FIG. 15 has the capacitors to store the charges, so that the output signal can be enlarged.

On one hand, if the photosensors $E_1$ to $E_9$, capacitors $C_1$ to $C_9$, and switching transistors $T_1$ to $T_9$ are formed on the same substrate by way of a thin film semiconductor, there is an advantage such that the number of connecting points with external circuits can be reduced or the like.

EXAMPLE 11

An image reading apparatus was constituted using the photosensors of the invention derived in Example 9.

Figure 17:
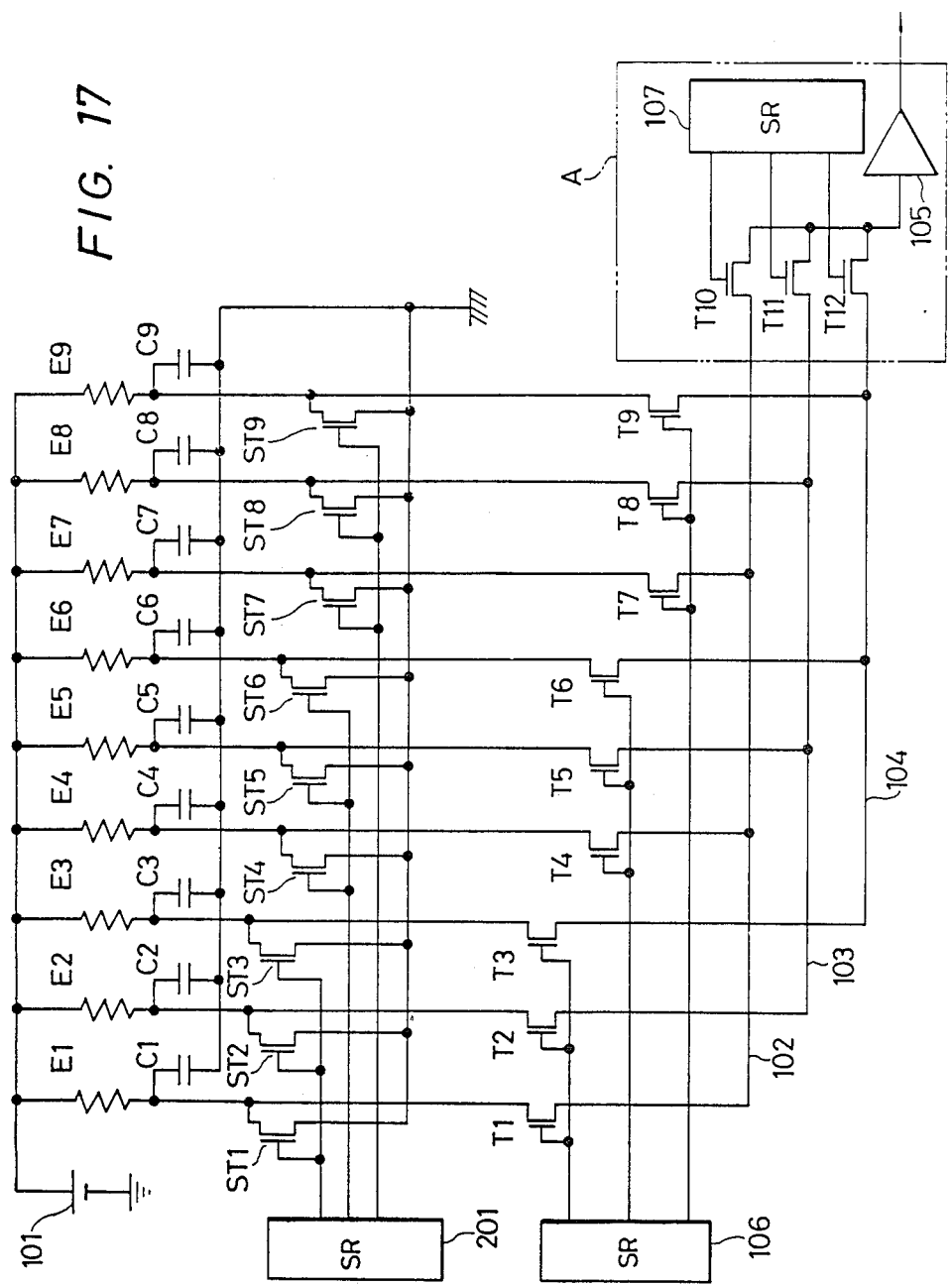

FIG. 17 is a circuit diagram of such an apparatus.

In this Example, however, the arrangement of the photosensors $E_1$ to $E_9$, capacitors $C_1$ to $C_9$, switching transistors $T_1$ to $T_{12}$, and shift registers 106 and 107, etc. is substantially the same as that shown in FIG. 16; therefore, its description is omitted.

In FIG. 17, the individual electrodes of the photosensors $E_1$ to $E_9$ are grounded through switching transistors $ST_1$ to $ST_9$, respectively. Namely, the switching transistors $ST_1$ to $ST_9$ are respectively connected in parallel with the capacitors $C_1$ to $C_9$.

Gate electrodes of the switching transistors $ST_1$ to $ST_9$ are commonly connected on a block unit basis similarly to the gate electrodes of the switching transistors $T_1$ to $T_9$ and are connected to parallel output terminals of shift register 201 on a block unit basis.

Therefore, the switching tarnsistors $T_1$ to $T_9$ are turned on a block unit basis at the shift timings of the shift register 201.

The operation of this Example having such an arrangement will then be explained using timing charts shown in FIGS. 18A to 18I for the switching transistors $T_1$ to $T_{12}$ and $ST_1$ to $ST_9$ shown in FIG. 17.

First, when the light enters the photosensors $E_1$ to $E_9$, the charges are accumulated into the capacitor $C_1$ to $C_9$ from the power source 101 in accordance with the magnitude of this light.

The high level signals are first outputted from the first parallel output terminals of the shift register 106, so that the switching transistors $T_1$ to $T_3$ are turned on (FIG. 18A).

During this interval, the shift register 107 is shifted and the switching transistors $T_{10}$ to $T_{12}$ are sequentially turned on (FIGS. 18D to 18F). In other words, the photo information stored in the capacitors $C_1$ to $C_3$ in the first block is sequentially read out.

Upon completion of the read-out of the information in the last capacitor $C_3$ in the first block, the shift register 106 is shifted and the high level signals are outputted from the second parallel output terminals, so that the switching transistors $T_4$ to $T_6$ are turned on (FIG. 18B).

Simultaneously, the high level signals are outputted from the first parallel output terminals of the shift register 201, thereby allowing the switching transistors $ST_1$ to $ST_3$ to be turned on. Thus, the residual charges in the capacitors $C_1$ to $C_3$ are completely discharged (FIG. 18G).

In parallel with this discharging operation, the switching transistors $T_{10}$ to $T_{12}$ are sequentially turned on due to the shifting of the shift register 107 while the switching transistors $T_4$ to $T_6$ are in the ON state, so that the photo information stored in capacitors $C_4$ to $C_6$ in the second block is sequentially read out (FIGS. 18D to 18F).

Next, in parallel with the reading operation of the light information in the third block (FIG. 18C), the charges in the capacitors $C_4$ to $C_6$ in the second block are discharged (FIG. 18H). The above operation is repeated on a block unit basis.

As described above, in parallel with the read-out of the next block, the capacitors in the block of which the read-out of the photo information has been finished can be allowed to discharge, thereby making it possible to reduce the operating time as a whole.

FIG. 19 shows another Example of the present invention, in which only the section A in FIG. 17 differs.

That is, amplifiers 202 to 204 are connected to the common lines 102 to 104, respectively, and respective outputs of the amplifiers 202 to 204 are connected to parallel input terminals of a shift register 205. The image information is serially outputted from series output terminals of the shift register 205.

Therefore, in this arrangement, the information in one block is simultaneously inputted to the shift register 205 and subsequently the serial image information is outputted due to the shifting of the shift register 205.

In this Example as well, when the information in one block is outputted from the shift register 205, the discharge of the capacitors in this block and the read-out from the next block can be performed in parallel.

On the other hand, as the switching transistors $ST_1$ to $ST_9$, thin-film transistors may be used similarly to the switching transistors $T_1$ to $T_9$. In such a case, they can be formed on the same substrate together with other circuit elements.

The use of the thin-film transistors as the switching transistors $ST_1$ to $ST_9$ as well enables the discharge of the capacitors in a certain block and the read-out from the next block to be performed in parallel. Therefore, the overall readout time is reduced as compared with that in the apparatus in Example 10.

EXAMPLE 12

Figure 22:
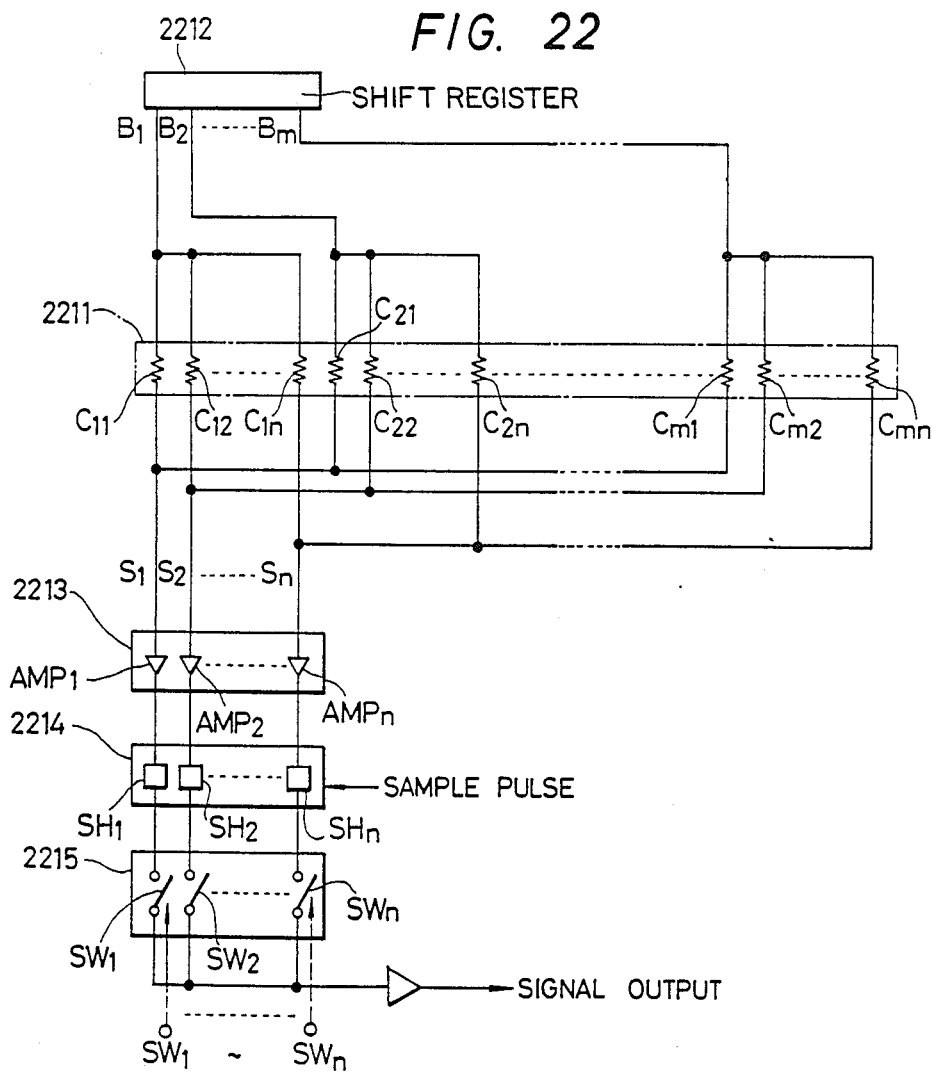
FIGS. 22 and 25 are diagrams of matrix drive circuits, respectively.

FIG. 22 shows a drive circuit diagram in the case where the long size photosensor array (shown in FIGS. 20 and 21) manufactured in a substantially similar manner as in the case of Example 9 is divided into a matrix of 32 bits×27 blocks and is matrix driven. In FIG. 22, a reference numeral 2211 denotes a photoconductive layer of the photosensor array; 2212 is a shift register; 2213 a current amplifier; 2214 sample-hold means; and 2215 a switching array.

Figure 23:
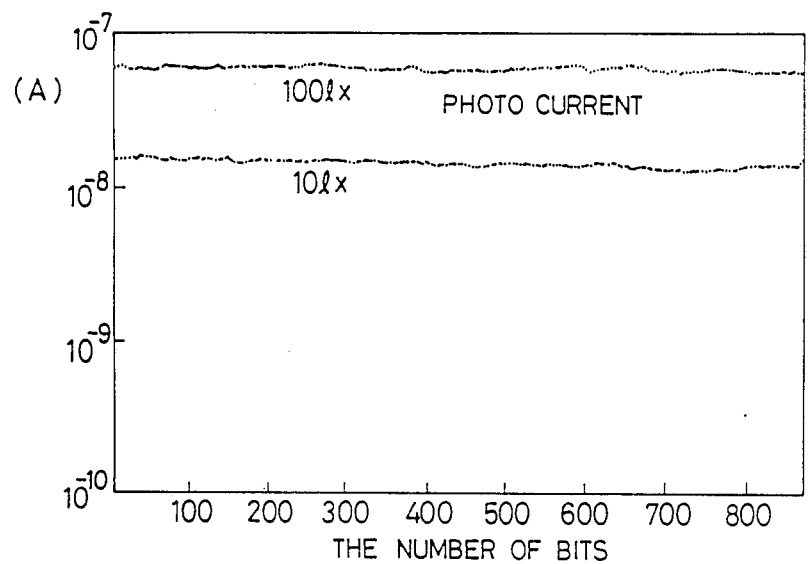
FIGS. 23 and 24 are graphs showing the characteristics of the photo current in the photosensor array.

FIG. 23 shows the values of the photo currents under the incident lights of 100 lx and 10 lx from the side of the substrate 2001 when the above-mentioned photosensor array was matrix driven by the circuit of FIG. 22. It will be understood from this diagram that a variation in photo current between the bits is small.

On the other hand, for the purpose of comparison, the planar type photosensor array (hereinafter, this array is abbreviated as a "comparison photosensor array B") was manufactured in a similar manner as the foregoing processes excluding that the surface of the same glass substrate as the above-mentioned one was treated for 30 seconds by the mixed liquid in which hydrofluoric acid (aqueous solution of 49 volume %), nitric acid (aqueous solution of 60 volume %) and acetic acid were mixed at the volume ratio of 1:5:40 and the a-Si:H under layer was not formed.

Figure 24:
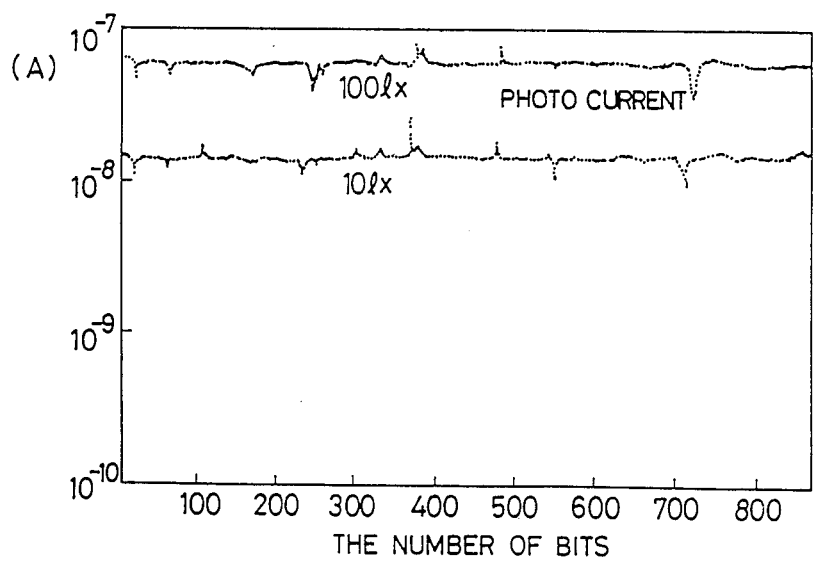
Figure 25:
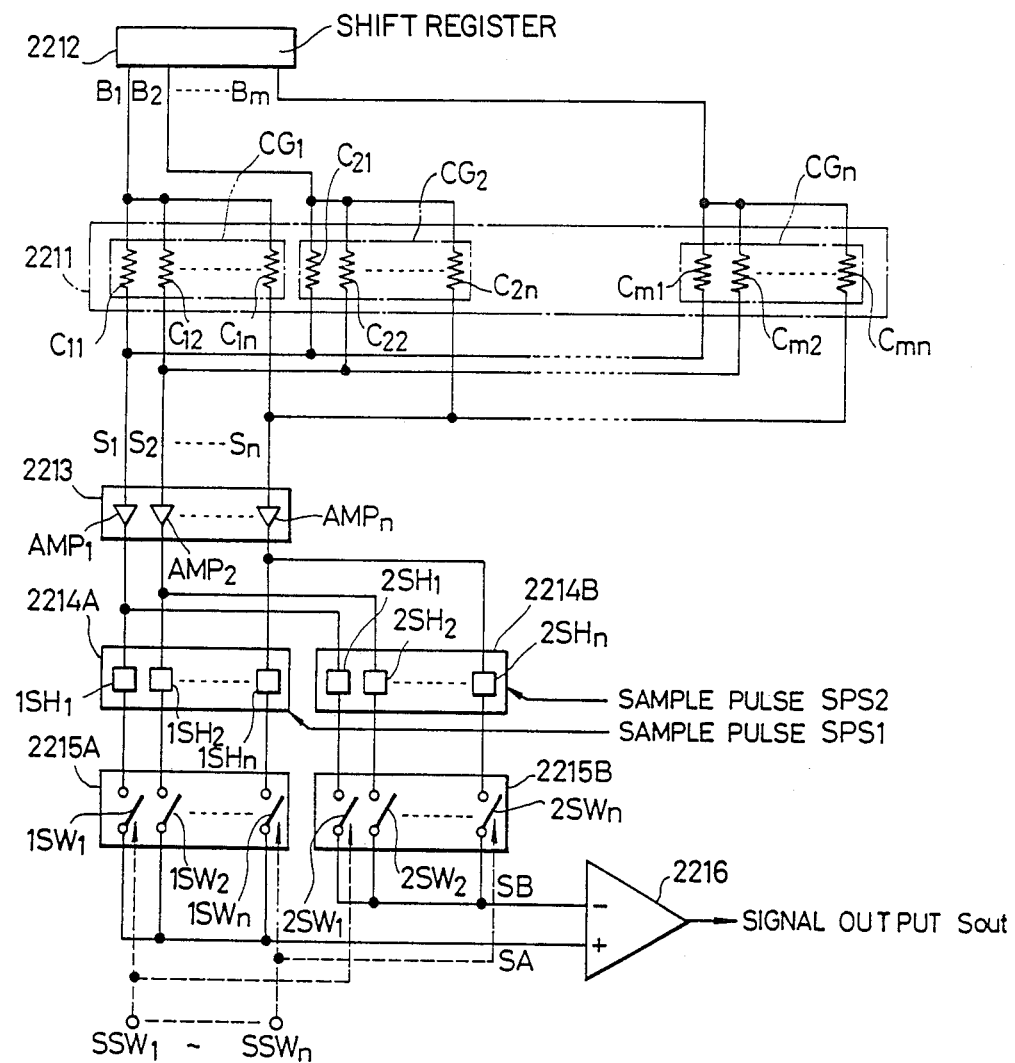

FIG. 24 shows the values of the photo currents under the incident lights of 100 lx and 10 lx from the side of the substrate 2001 in the case where the comparison photosensor array B was matrix driven by the circuit of FIG. 22. It will be understood from this diagram that there is a large variation in photo current between the bits.

As will be appreciated from the comparison between FIGS. 23 and 24, the values of the photo currents derived are almost equal in both of these cases. From this result, it will be understood that the photo current characteristic is not deteriorated by the existence of the a-Si:H under layer 2 in the photosensor array of the apparatus of the invention.

Next, durability tests by way of heat cycling were performed under the same conditions with respect to the above-mentioned two kinds of photosensor arrays, so that it has been similarly found that peel-off of the film did not occur and sufficient adhesive property was preserved.

EXAMPLE 13

The ordinary cleaning was carried out using the neutral detergent or organic alkali system detergent to the glass substrate (#7059 made by Corning Glass Works Co., Ltd.) whose both sides have already been polished. Next, Cr was deposited to have the thickness of $0.15\mu$ due to the electron beam evaporation method and a photo resist pattern of a desired shape was formed using the positive type photo resist (trade name AZ-1370 made by Shiplay Co., Ltd.). Thereafter, the unnecessary portion of Cr was removed using the mixed aqueous solution consisting of ammonium secondary cerium nitrate and perchlorate acid, so that the lower layer electrode 2607 and gate electrode 2608 of the capacitor were formed.

Next, the glass substrate 2601 was covered by a mask of a desired pattern and was set in the glow discharge decomposition apparatus of the capacitive coupling type (shown in FIG. 1) and was maintained at 230° C. under the exhaust vacuum of $1 \times 10^{-6}$ Torr. Next, the epitaxial grade pure $SiH_4$ gas (made by Komatsu Electronics Co., Ltd.) was allowed to flow into this apparatus at the flow rate of 10 SCCM and the gas pressure was set to 0.07 Torr. Thereafter, the glow discharge was performed for two minutes at the input voltage of 2.0 kV and using the RF (Radio Frequency) discharge power of 120 W by use of the high frequency power source of 13.56 MHz, thereby forming the a-Si:H under layer 2602 having the thickness of about 400 Å. Then, the input voltage was immediately reduced to 0.3 kV and the glow discharge was carried out for 4.5 hours using the discharge power of 8 W, so that the a-Si (H,X) layer 2603 of the thickness of about $0.8\mu$ was formed.

Subsequently, the $n^+$ layer 2604 (of the thickness of about $0.15\mu$) serving as the ohmic contact layer was deposited with the discharge power of 30 W using the mixed gases, as a raw material, in which $SiH_4$ diluted to 10% by $H_2$ and $PH_3$ diluted to 100 ppm by $H_2$ were mixed at the mixture ratio of 1:10.

Next, $SiH_4$ diluted to 10% by $H_2$ was allowed to flow at the flow rate of 5 SCCM and $NH_3$ was allowed to flow at the flow rate of 20 SCCM. Then, the glow discharge was performed for two hours using the discharge power of 15 W, so that the insulation layer 2609 consisting of silicone nitride was formed to a thickness of $0.3\mu$.

Next, in a similar manner as in the case of formation of the a-Si (H,X) layer 2603 in the foregoing photoelectric converting section, $SiH_4$ diluted to 10% by $H_2$ was allowed to flow at the flow rate of 20 SCCM and the glow discharge was performed for one and half hours with the discharge power of 20 W, so that the a-Si:H semiconductor layer 2610 of the thickness of $0.20\mu$ was formed. On one hand, the $n^+$ layer 2611 of the thickness of $0.1\mu$ was formed similarly to the case of the formation of the $n^+$ layer 2604 in the photoelectric converting section.

Subsequently, a desired pattern was formed and dry etching by way of the $CF_4$ gas was carried out using the RF discharge power of 100 W and at the gas pressure of 0.30 Torr due to the plasma etching method, thereby removing the $n^+$ layer 2611 and semiconductor layer 2610 in the unnecessary portions.

Then, the mask in the photoelectric converting section was removed and Al was deposited by way of the electron beam evaporation method to have the thickness of $0.5\mu$ and the conductive layer was formed. Subsequently, a photo resist pattern of a desired shape was formed using the positive type photo resist. (AZ-1370 made by Shiplay Co., Ltd.). After that, the conductive layer in the exposed portion was removed by the etching liquid in which phosphoric acid (aqueous solution of 85 volume %), nitric acid (aqueous solution of 60 volume %), glacial acetic acid, and water were mixed at the volume ratio of 16:1:2:1, so that the common electrode 2605, individual electrode 2606 and signal takeout line 2612 were formed. Then, dry etching was performed by way of the $CF_4$ gas using the RF discharge power of 120 W at the gas pressure of 0.07 Torr due to the plasma etching method using the plane parallel plate type apparatus, thereby removing the $n^+$ layer in the exposed portions. Thus, the $n^+$ layers 2604 and 2611 of desired patterns were formed. Then, the photo resist was peeled off.

In this way, the photosensor array having 864 photosensors such as shown in FIGS. 26 and 27 was obtained.

On the other hand, for the purpose of comparison, the planar type photosensor array (hereinafter, this array is abbreviated as a "comparison photosensor array C") was manufactured in a similar manner as the foregoing processes excluding that the surface of the same glass substrate as the above-mentioned one was treated for 30 seconds by the liquid in which hydrofluoric acid (aqueous solution of 49 volume %), nitric acid (aqueous solution of 60 volume %) and acetic acid were mixed at the volume ratio of 1:5:40 and the a-Si:H under layer was not formed.

With regard to the above-mentioned two kinds of photosensor arrays, the values of the photo currents derived by allowing the light of $\lambda_{max}=565$ mm to enter from the side of the glass substrate 1 under the same conditions were compared, so that almost equal values were obtained in both of those cases. From this result, it will be understood that the photo current characteristic is not deteriorated by the existence of the a-Si:H under layer 2602 in the photosensor array of the apparatus of the invention.

Next, durability tests by way of heat cycling were performed under the same conditions with regard to the above-mentioned two kinds of photosensor arrays, so that it has been similarly found that peel-off of the film did not occur the sufficient adhesive property was preserved.

While specific embodiments of the invention have been described in detail, the invention should not be limited to any structures described herein and instead should be determined by reference to the following claims.

What is claimed is:

1. A long size image sensor unit for detecting on image on an original, said unit comprising:
 a photosensor array consisting of a plurality of photosensors arranged like an array, each of said photosensors having a photoconductive layer containing amorphous silicon provided on a substrate, said photoconductive layer consisting of at least two laminated films each having different refractive indexes, the refractive index of the laminated film provided directly on the substrate being not larger than 3.2 for the light of a wavelength of 6328 Å, a pair of electrodes provided in electrical contact with said photoconductive layer of said photosensor, and photosensing section formed in said photoconductive layer and exposable to said image between said pair of electrodes; and
 a light source to illuminate the original.

2. An image sensor unit according to claim 1, wherein said light source is an LED light source.

3. An image sensor unit according to claim 1, wherein said light source is a fluorescent lamp.

4. An image sensor unit according to claim 1, wherein an optical image-formation line array of the converging type is arranged in the optical path between the original and the photosensor array.

5. An image sensor unit according to claim 1, wherein the thickness of the of the film provided directly on the substrate is not larger than 1000 Å.

6. An image sensor unit according to claim 1, wherein said pair of electrodes are arranged parallel to each other with a predetermined distance therebetween on an adjacent portion of a surface which includes said photoconductive layer.

7. An image sensor unit according to claim 1, wherein said amorphous silicon is a hydrogenated morphous silicon.

8. An image sensor unit according to claim 1, wherein hydrogen atoms are contained in said photoconductive layer.

9. An image sensor unit according to claim 1, wherein said pair of electrodes for one of said plurality of photosensor is formed in parallel with pairs of electrodes for others of said plurality of photosensors.

10. An image sensor unit according to claim 1, wherein one electrode of said pair of electrodes is provided in common for each of said plurality of photosensors.

11. An image sensor unit according to claim 1, further comprising driving means for driving said plurality of photosensors and heat radiating means for cooling said driving means.

12. An image sensor unit according to claim 2, wherein said light source has a plurality of LED light sources.

13. An image reading apparatus for detecting an image on an original, said apparatus having a long size image sensor unit comprising:
 a photosensor array consisting of a plurality of photosensors arranged like an array, each of said photosensors having a photoconductive layer containing amorphous silicon provided on a substrate, said photoconductive layer consisting of at least two laminated films having different refractive indexes, the refractive index of the laminated film provided directly on the substrate being not larger than 3.2 for the light of a wavelength of 6328 Å, a pair of electrodes provided in electrical contact with said photoconductive layer of said photosensor, and a photosensing section formed in said photoconductive layer and exposable to said image between said pair of electrodes; and
 a light source to illiminate the original.

14. An image sensor unit according to claim 1, further comprising matrix drive circuit means for matrix driving each of said photosensors.

15. An image sensor unit according to claim 1, wherein said photosensor array is divided into a plurality of blocks in which one block unit is constituted by a set of a predetermined number of said photosensors from said photosensor array.

16. An image sensor unit according to claim 1, further comprising:

accumulating means corresponding to each of said photosensors for accumulating each output signal of said photosensors; and switching means for sequentially taking out the signals accumulated in said accumulating means.

17. A photosensor comprising:

a photoconductive layer containing amorphous silicon provided on a substrate, said photoconductive layer consisting of at least two laminated films each having different refractive indexes, the refractive index of the laminated film provided directly on the substrate being not larger than 3.2 for the light of a wavelength of 6328 Å;

a pair of electrodes provided in electrical contact with said photoconductive layer; and a photosensing section formed in said photoconductive layer and exposable to said image between said pair of electrodes.

* * * * *

UNITED STATES PATENT AND TRADEMARK OFFICE
CERTIFICATE OF CORRECTION

PATENT NO. : 4,763,010
DATED : August 9, 1988
INVENTOR(S) : MASAKI FUKAYA, ET AL.

It is certified that error appears in the above-identified patent and that said Letters Patent is hereby corrected as shown below:

AT [57] IN THE ABSTRACT

Line 9, "photo sensing" should read --photosensing--.

COLUMN 1

Line 20, "used a" should read --used as a--.
Line 35, "photosensing" should read --a photosensing--.
Line 51, "the" should be deleted.

COLUMN 2

Line 13, "a" (second occurrence) should be deleted.
Line 18, "long" should read --a long--.
Line 19, "a" should be deleted.
Line 32, "the peel-off" should read --peel-off--.
Line 39, "photo sensor" should read --photosensor--.
Line 50, "photo sensing" should read --photosensing--.
Line 63, "photo sensing" should read --photosensing--.

COLUMN 3

Line 3, "cross sectional" should read --cross-sectional--.
Line 7, "cross sectional" should read --cross-sectional--.
Line 16, "cross sectional" should read --cross-sectional--.
Line 24, "cross sectional" should read --cross-sectional--.
Line 31, "FIG. 17" should read --FIG. 17;--.
Line 34, "cross sectional" should read --cross-sectional--.
Line 42, "cross sectional" should read --cross-sectional--.
Line 44, "cross sectional" should read --cross-sectional--.
Line 58, "cross sectional" should read --cross-sectional--.

UNITED STATES PATENT AND TRADEMARK OFFICE
CERTIFICATE OF CORRECTION

PATENT NO. : 4,763,010
DATED : August 9, 1988
INVENTOR(S) : MASAKI FUKAYA, ET AL.

It is certified that error appears in the above-identified patent and that said Letters Patent is hereby corrected as shown below:

COLUMN 4

Line 35, "substrate" should read --the substrate--.
Line 36, "the peel-off" should read --peel-off--.
Line 55, "photo conductivity" should read --photoconductivity--.
Line 63, "photo con-" should read --photocon- --.

COLUMN 5

Line 3, "cross" should read --cross- --.
Line 8, "photo conductive" should read --photoconductive--.
Line 25, "cross sec-" should read --cross-sec- --.

COLUMN 6

Line 25, "ethcing" should read --etching--.
Line 39, "excluding" should read --except--.
Line 65, "Example 1," should read --Example 2,--.
Line 66, "exclusing" should read --except--.

COLUMN 7

Line 11, "photo li-" should read --photoli- --.

UNITED STATES PATENT AND TRADEMARK OFFICE
CERTIFICATE OF CORRECTION

PATENT NO. : 4,763,010
DATED : August 9, 1988
INVENTOR(S) : MASAKI FUKAYA, ET AL.

It is certified that error appears in the above-identified patent and that said Letters Patent is hereby corrected as shown below:

COLUMN 8

Line 6, "ple 1," should read --ple 4,--.
Line 7, "excluding" should read --except--.
Line 11, "cross sectional" should read --cross-sectional--.
Line 31, "ple 1," should read --ple 5,--.
Line 32, "excluding" should read --except--.
Line 45, "ple 1," should read --ple 6,--.
Line 46, "excluding" should read --except--.
Line 46, "duluted" should read --diluted--.
Line 60, "ple 1," should read --ple 7,--.
Line 61, "excluding" should read --except--.
Line 62, "a-Si:h" should read --a-Si:H--.

COLUMN 9

Line 8, "photo lithography" should read --photolithography--.
Line 13, "photo" should read --photo- --.
Line 17, "Uniformites" should read --Uniformities--.
Line 44, "whose" should read --whole--.
Line 62, "cross" should read --cross- --.

COLUMN 10

Line 18, "cross sectional" should read --cross-sectional--.

UNITED STATES PATENT AND TRADEMARK OFFICE
CERTIFICATE OF CORRECTION

PATENT NO. : 4,763,010
DATED : August 9, 1988
INVENTOR(S) : MASAKI FUKAYA, ET AL.

It is certified that error appears in the above-identified patent and that said Letters Patent is hereby corrected as shown below:

COLUMN 12

Line 14, "tarnsistors" should read --transistors--.
Line 15, "turned on" should read --turned on on--.
Line 22, "capacitor" should read --capacitors--.

COLUMN 13

Line 43, "excluding" should read --except--.

COLUMN 15

Line 24, "excluding" should read --except--.
Line 33, "$\lambda_{max}$=565 mm" should read --$\lambda_{max}$=565 nm--.
Line 45, "the" should read --and--.
Line 53, "on" should read --an--.

UNITED STATES PATENT AND TRADEMARK OFFICE
CERTIFICATE OF CORRECTION

PATENT NO. : 4,763,010
DATED : August 9, 1988
INVENTOR(S) : MASAKI FUKAYA, ET AL.

It is certified that error appears in the above-identified patent and that said Letters Patent is hereby corrected as shown below:

COLUMN 16

Line 7, "line" should read --lens--.
    Line 11, "of the" (second occurrence) should be deleted.
    Line 19, "morphous" should read --amorphous--.
    Line 26, "sensor" should read --sensors--.

Signed and Sealed this

Fourteenth Day of March, 1989

Attest:

DONALD J. QUIGG

*Attesting Officer*  *Commissioner of Patents and Trademarks*